United States Patent
Liang et al.

(10) Patent No.: US 9,960,175 B2
(45) Date of Patent: May 1, 2018

(54) FIELD EFFECT TRANSISTOR MEMORY DEVICE

(71) Applicant: THE REGENTS OF THE UNIVERSITY OF MICHIGAN, Ann Arbor, MI (US)

(72) Inventors: Xiaogan Liang, Ann Arbor, MI (US); Hongsuk Nam, Ann Arbor, MI (US); Sungjin Wi, Ann Arbor, MI (US); Mikai Chen, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days. days.

(21) Appl. No.: 15/123,693

(22) PCT Filed: Mar. 6, 2015

(86) PCT No.: PCT/US2015/019247
§ 371 (c)(1),
(2) Date: Sep. 6, 2016

(87) PCT Pub. No.: WO2015/134904
PCT Pub. Date: Sep. 11, 2015

(65) Prior Publication Data
US 2017/0018561 A1  Jan. 19, 2017

Related U.S. Application Data

(60) Provisional application No. 61/948,633, filed on Mar. 6, 2014.

(51) Int. Cl.
*H01L 27/115* (2017.01)
*H01L 27/11568* (2017.01)
(Continued)

(52) U.S. Cl.
CPC ........ *H01L 27/11568* (2013.01); *B29C 59/02* (2013.01); *H01L 21/3065* (2013.01);
(Continued)

(58) Field of Classification Search
CPC ............. H01L 27/11568; H01L 29/792; H01L 29/66833; H01L 29/4234; H01L 21/3065;
(Continued)

(56) References Cited

U.S. PATENT DOCUMENTS 7,972,896 B2  7/2011 Kim
8,139,391 B2  3/2012 Scheuerlein
(Continued)

FOREIGN PATENT DOCUMENTS

WO  WO-2005064614 A1  7/2005
WO  WO-2011132529 A1  10/2011
WO  WO-2012093360 A1  7/2012

OTHER PUBLICATIONS

Ye Zhou et al "Nonvolatile multilevel data storage memory device from controlled ambipolar charge trapping mechanism", Sci Rep 2013; 3:2319 (2013).
(Continued)

*Primary Examiner* — Marc Armand
*Assistant Examiner* — Sue Tang
(74) *Attorney, Agent, or Firm* — Harness, Dickey & Pierce, P.L.C.

(57) ABSTRACT

A method for generating a non-volatile memory device may comprise: applying plasma for a preset time period to an exposed surface of a channel of a field effect transistor such that a plurality of charge-trapping sites are formed at the channel. The channel is comprised of a multi-layer structure of atomically thin two-dimensional sheets.

16 Claims, 12 Drawing Sheets

(51) Int. Cl.
  *H01L 31/18*   (2006.01)
  *H01L 31/032*  (2006.01)
  *H01L 21/467*  (2006.01)
  *B29C 59/02*   (2006.01)
  *H01L 29/16*   (2006.01)
  *H01L 31/068*  (2012.01)
  *H01L 29/786*  (2006.01)
  *H01L 21/3065* (2006.01)
  *H01L 29/423*  (2006.01)
  *H01L 29/66*   (2006.01)
  *H01L 29/792*  (2006.01)

(52) U.S. Cl.
  CPC ........ *H01L 21/467* (2013.01); *H01L 29/1606* (2013.01); *H01L 29/4234* (2013.01); *H01L 29/66833* (2013.01); *H01L 29/78681* (2013.01); *H01L 29/792* (2013.01); *H01L 31/032* (2013.01); *H01L 31/068* (2013.01); *H01L 31/18* (2013.01); *H01L 31/1884* (2013.01); *Y02E 10/547* (2013.01); *Y02P 70/521* (2015.11)

(58) Field of Classification Search
  CPC ............. H01L 29/78681; H01L 31/068; H01L 29/1606; H01L 31/18; H01L 31/032; H01L 21/467; H01L 31/1884; B29C 59/02; Y02E 10/547
  USPC .......................................................... 257/314
  See application file for complete search history.

(56) References Cited

U.S. PATENT DOCUMENTS

| | | | |
|---|---|---|---|
| 2001/0010967 A1* | 8/2001 | Chen | H01L 21/28185 438/585 |
| 2003/0022435 A1 | 1/2003 | Chen | |
| 2007/0020827 A1* | 1/2007 | Buh | H01L 29/42392 438/157 |
| 2007/0181938 A1 | 8/2007 | Bucher et al. | |
| 2009/0101962 A1* | 4/2009 | Hong | B82Y 10/00 257/322 |
| 2010/0193824 A1 | 8/2010 | Kim et al. | |
| 2011/0170330 A1 | 7/2011 | Oezyilmaz et al. | |
| 2013/0105824 A1* | 5/2013 | Paranjape | H01L 31/032 257/86 |
| 2014/0042494 A1* | 2/2014 | Han | H01L 29/78 257/192 |

OTHER PUBLICATIONS

International Search Report and Written Opinion for PCT/US2015/019247, dated Jun. 24, 2015; ISA/KR.

* cited by examiner

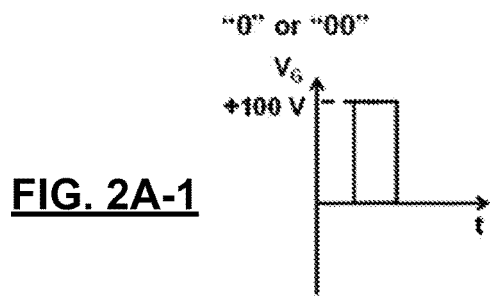
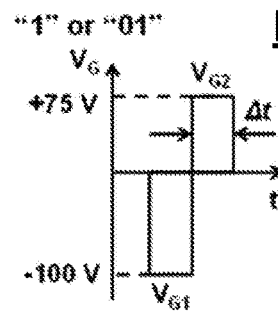
FIG. 2A-1
FIG. 2A-2
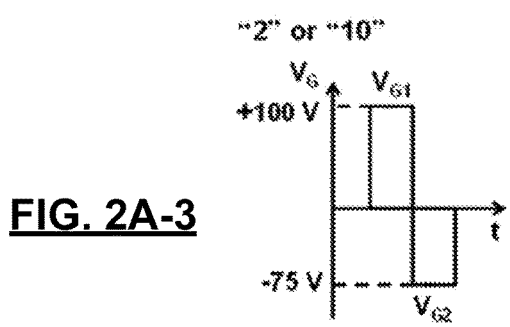
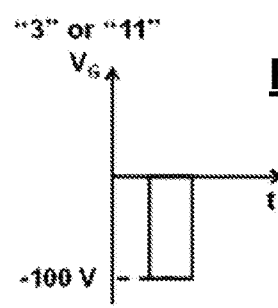
FIG. 2A-3
FIG. 2A-4
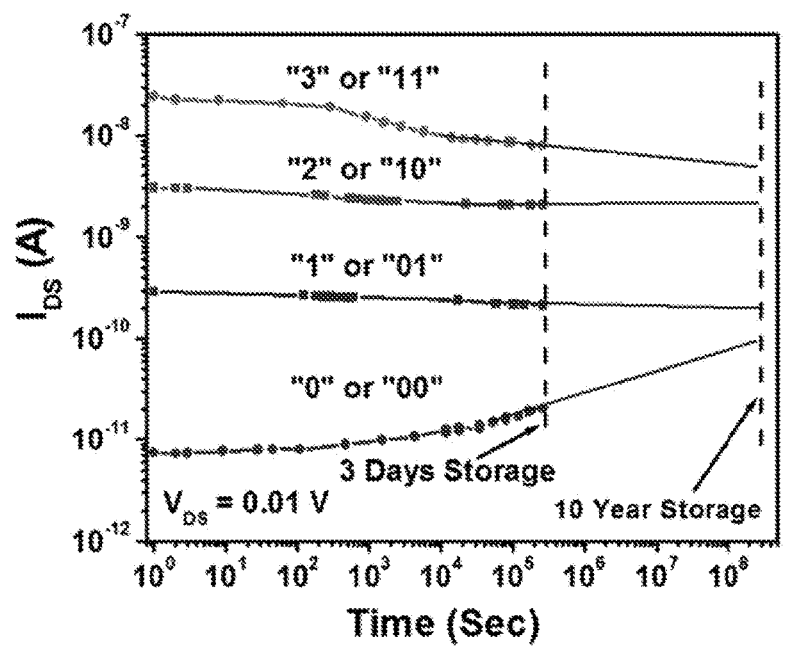
FIG. 2B

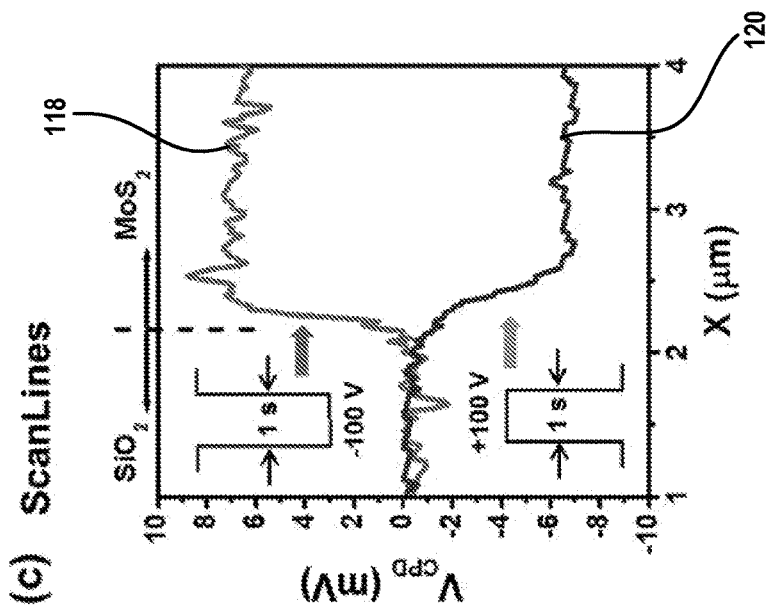
FIG. 6C
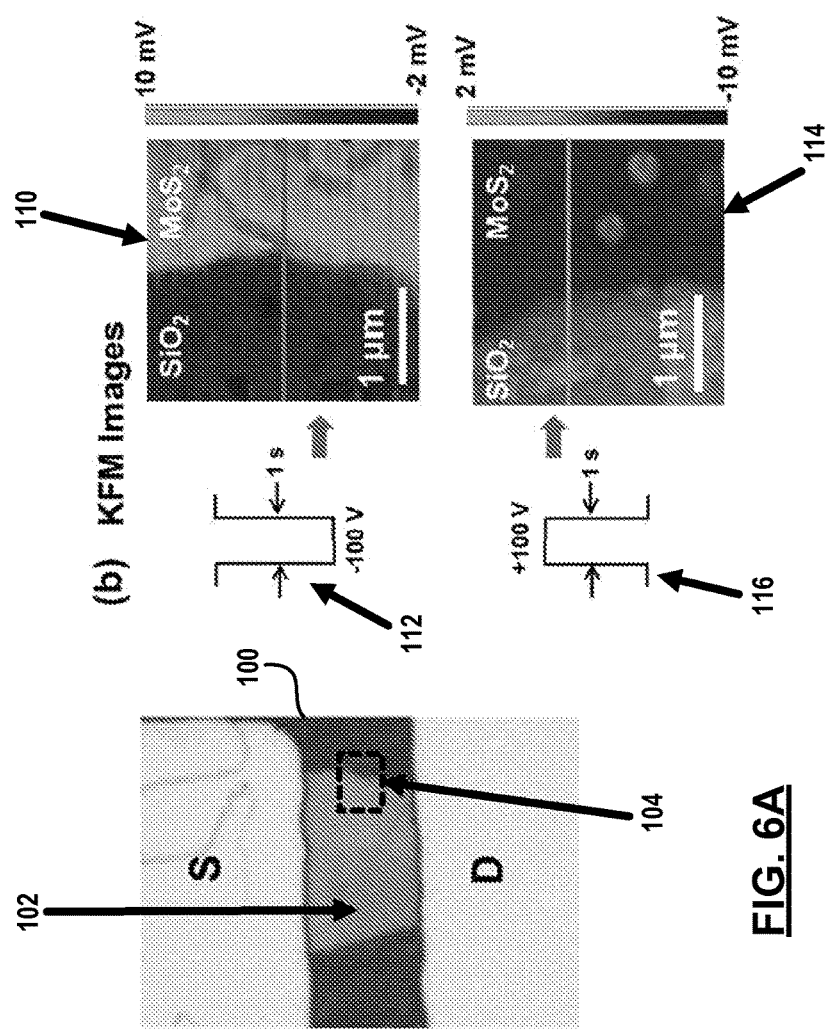
FIG. 6B
FIG. 6A

FIELD EFFECT TRANSISTOR MEMORY DEVICE

CROSS-REFERENCE TO RELATED APPLICATIONS

This application is a U.S. National Phase Application under 35 U.S.C. 371 of International Application No. PCT/US2015/019247 filed on Mar. 6, 2015 and published as WO 2015/134904 A1 on Sep. 11, 2015. This application claims the benefit of U.S. Provisional Application No. 61/948,633 filed on Mar. 6, 2014. The entire disclosures of the above applications are incorporated herein by reference.

GOVERNMENT INTEREST

This invention was made with government support under CMM11232883 awarded by the National Science Foundation. The Government has certain rights in the invention.

FIELD

The present disclosure relates to solid state drives based memory, and more particularly to memory devices formed by field effect transistors.

BACKGROUND

Solid state drives (SSDs) based on flash memory technology can be more expensive than hard disk drives (HDDs) in terms of cost per unit bit storage. To reduce the cost of SSDs, it is desirable to develop low-cost memory fabrication processes as well as new memory architectures for improving the storage density.

One such effort is to create multi-bit data storage memory devices to achieve a higher storage density. The fabrication of multi-bit (or multi-level cell (MLC)) flash memories can require precise deposition of multiple semiconductor layers and multiple overlay lithography processes to create complicated memory transistors consisting of multiple floating gates and blocking and tunneling layers. This significantly increases the complexity of the memory cells. While MLC flash memories are developed to enable low-cost manufacturing of such complicated cells, the future scale-down of MLC circuits may require new MLC with simpler architectures as well as updated manufacturing systems with lower processing cost and higher throughput.

Recent efforts have demonstrated other multi-bit memories based on different materials and device structures, including memories based on organic semiconductors with ambipolar transport properties, memory transistors based on nanostructured materials, flash memory-like transistors with capacitively coupled nanoparticle (NP)-based floating gates, and multi-level resistive memories based on phase-change materials. However, relatively complicated and expensive processes are still required to make these devices.

This section provides background information related to the present disclosure which is not necessarily prior art.

SUMMARY

This section provides a general summary of the disclosure, and is not a comprehensive disclosure of its full scope or all of its features.

In one aspect of the disclosure, a method for generating a non-volatile memory device is provided. The method includes: applying a plasma for a preset time period to an exposed surface of a channel of a field effect transistor such that a plurality of charge-trapping sites are formed at the channel. The channel may be comprised of a multi-layer structure of atomically thin two-dimensional sheets.

The preset time period for applying the plasma may be set between 5-20 seconds. Alternatively, the preset time period may be equal to or greater than one minute.

In another aspect of the disclosure, the channel may be made of a transition metal.

In yet another aspect of the disclosure, the plasma may be made of oxygen.

In another aspect of the disclosure, the method may further include: applying a polymer layer to a first area of the channel prior to applying the plasma, where the channel has the first area and a second area not having the polymer layer, and the first area is smaller than the second area; and removing the polymer layer from the first area after applying the plasma to the channel.

In yet another aspect of the disclosure, the charge-trapping sites may be formed between a first layer and a second layer of the channel, where the first layer is treated with the plasma and is above the second layer of the channel, which is not treated by the plasma. The first layer may include one or more sheets and the second layer may include one or more sheets different from the first layer.

In another aspect of the disclosure, the plasma may have at least one of a radio frequency power of approximately 200 W, a pressure of approximately 10 mTorr, and a precursor gas flow rate of approximately 10 sccm.

In an aspect of the disclosure, a memory device is provided. The memory device includes a field effect transistor that includes a source, a drain, a gate, and a channel portion located between the source and the drain. The channel portion may be comprised of a multi-layer structure of atomically thin two-dimensional sheets. The channel portion may include a first layer and a second layer and define multiple charge gaps between the first layer and the second layer. The first layer may include multiple ripples, and the multiple charge gaps may be defined by the multiple ripples and the second layer.

In an aspect of the disclosure, the first layer of the channel may be a plasma-doped layer and the second layer of the channel may be an un-doped layer.

In yet another aspect of the disclosure, the second layer of the channel may be substantially flat and under the first layer of the channel.

In an aspect of the disclosure, the field effect transistor may be made of molybdenum disulfide.

In yet another aspect of the disclosure, the field effect transistor may be a back gated transistor.

In an aspect of the disclosure a memory setting speed of the field effect transistor may be proportional to an area of the channel that includes the charge gaps.

In yet another aspect of the disclosure, the field effect transistor may store n-bits and includes $2^n$ distinguishable data levels, where n is an integer.

In an aspect of the disclosure, the first layer may include one or more sheets and the second layer may include one or more sheets different from the first layer. The one or more sheets of the first layer may be doped with plasma, and the one or more sheets of the second layer may be un-doped.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2C:
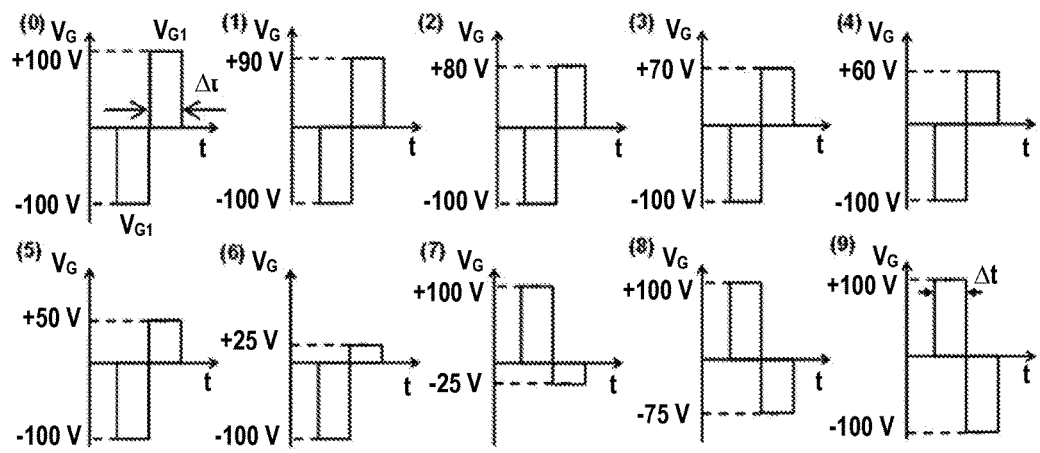
Figure 2D:
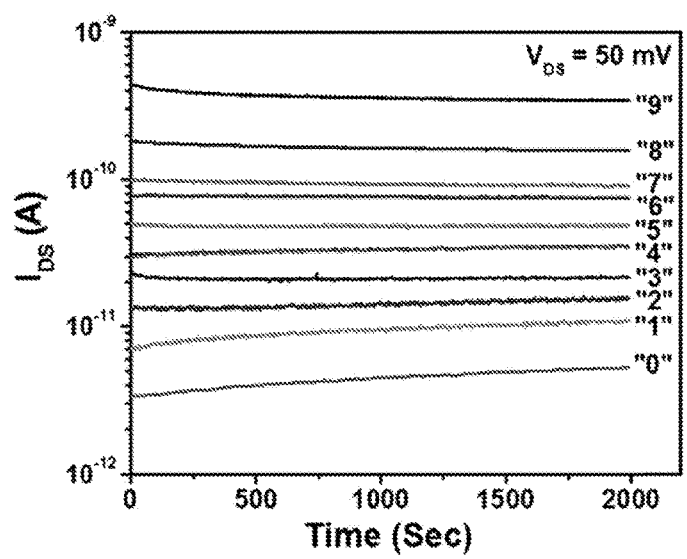

FIGS. 2A-1, 2A-2, 2A-3, and 2A-4 illustrate $V_G$ signals used for programming the memory FET into four data states;

FIG. 2B is a graph of retention characteristics of the four data states recorded for 3 days;

FIG. 2C illustrates the $V_G$ signals for programming the memory FET into ten data states;

FIG. 2D is a graph of retention characteristics of the ten data states for 2000 s.

Figure 3A:
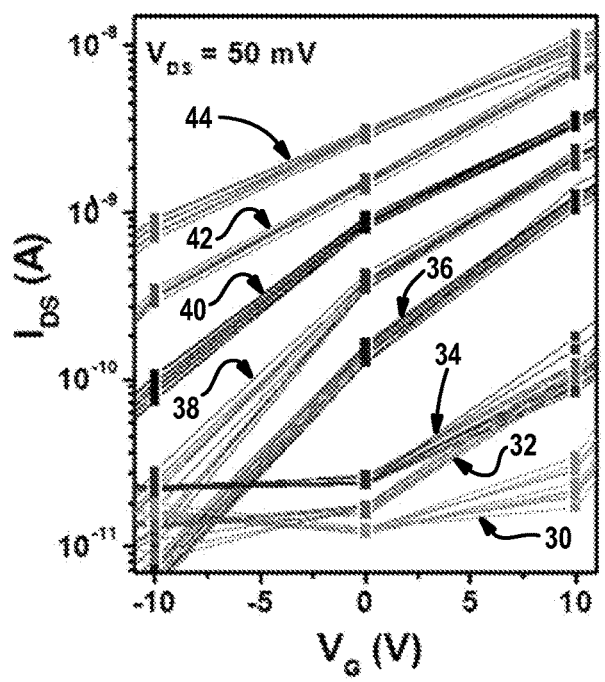
Figure 3B:
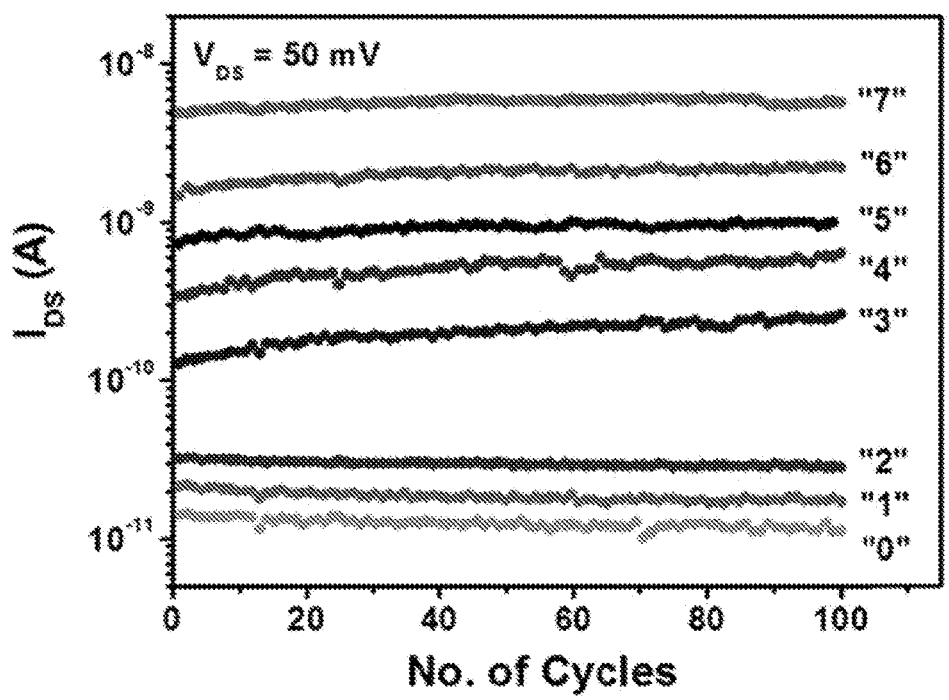
Figure 4A:
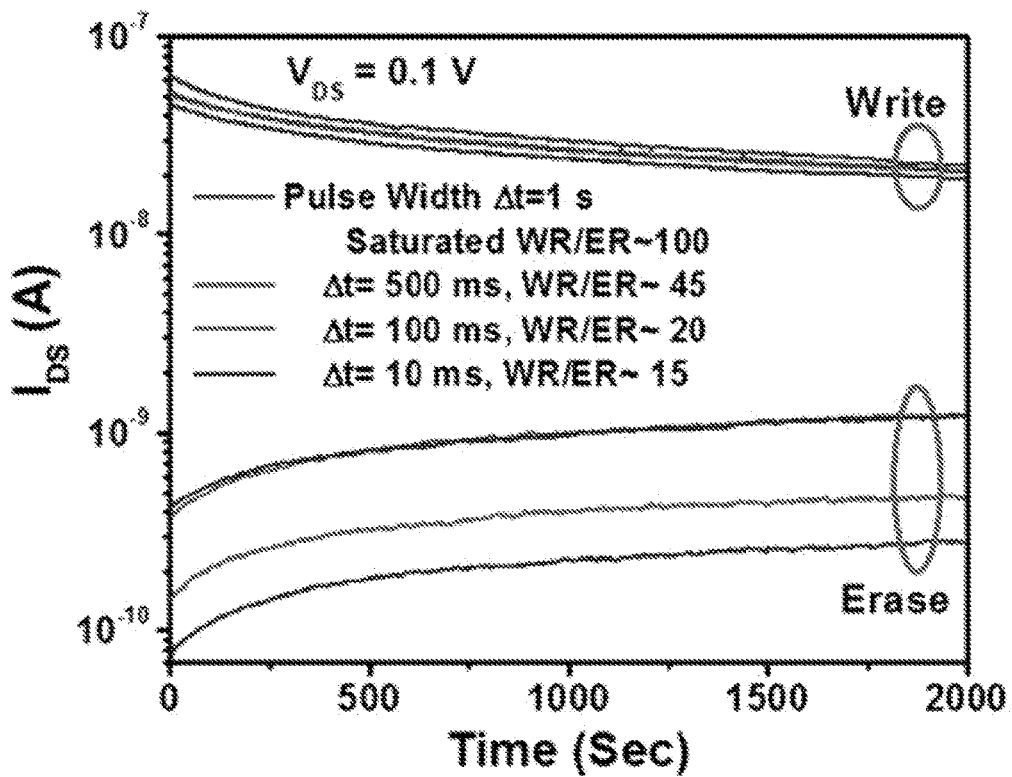
Figure 4B:
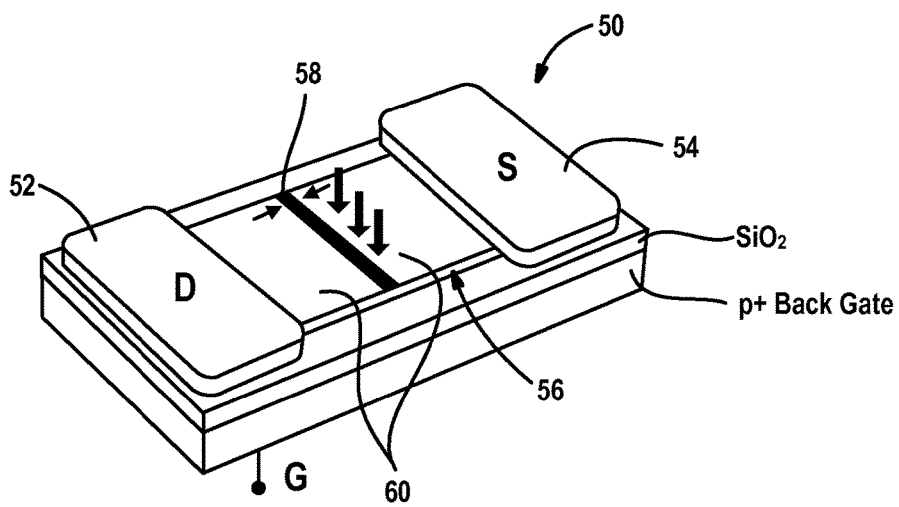
Figure 4C:
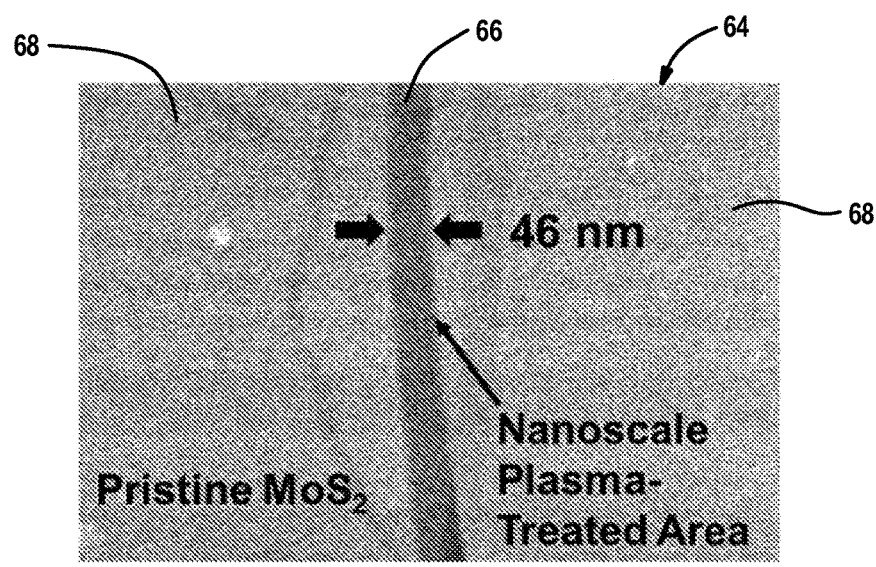
Figure 4D:
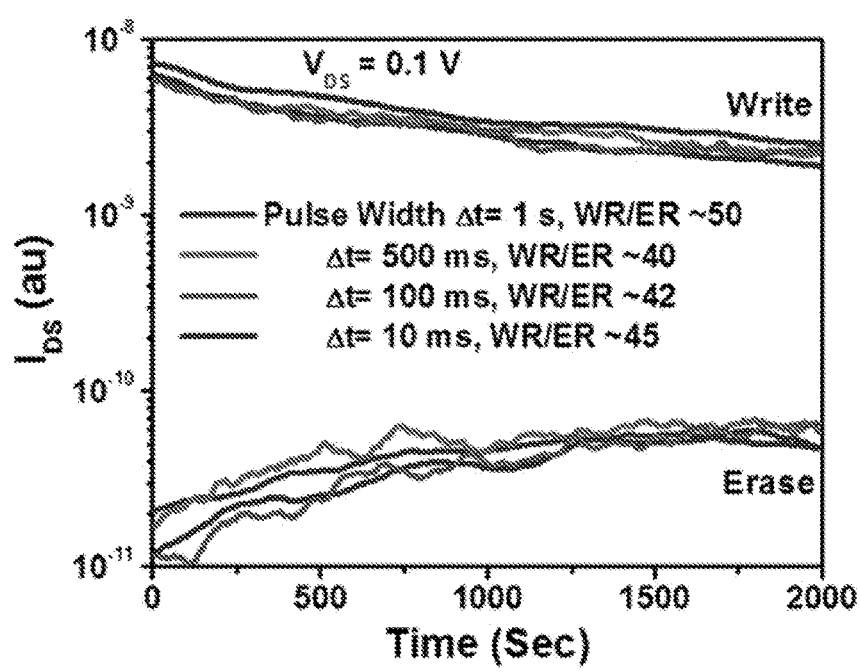
Figure 5A:
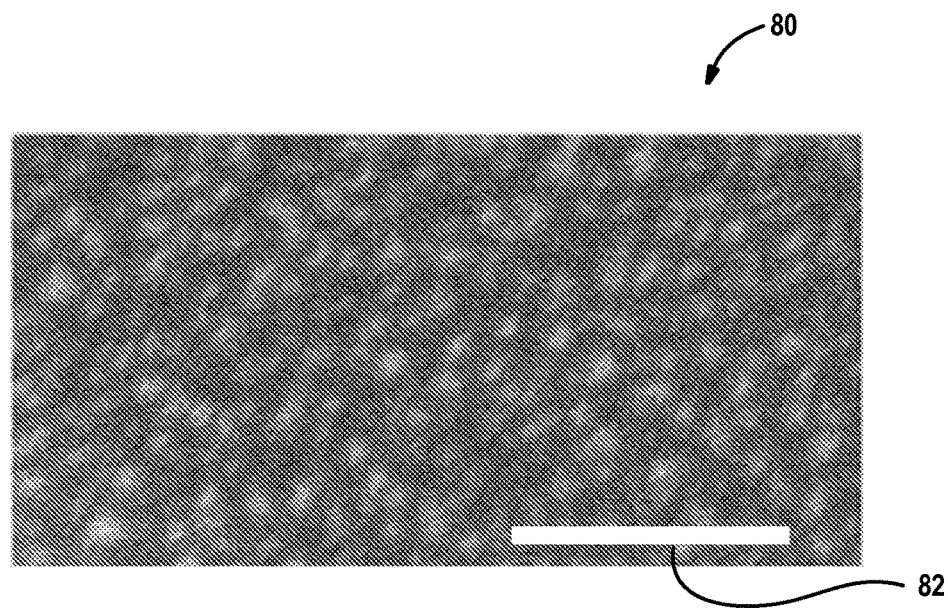
Figure 5B:
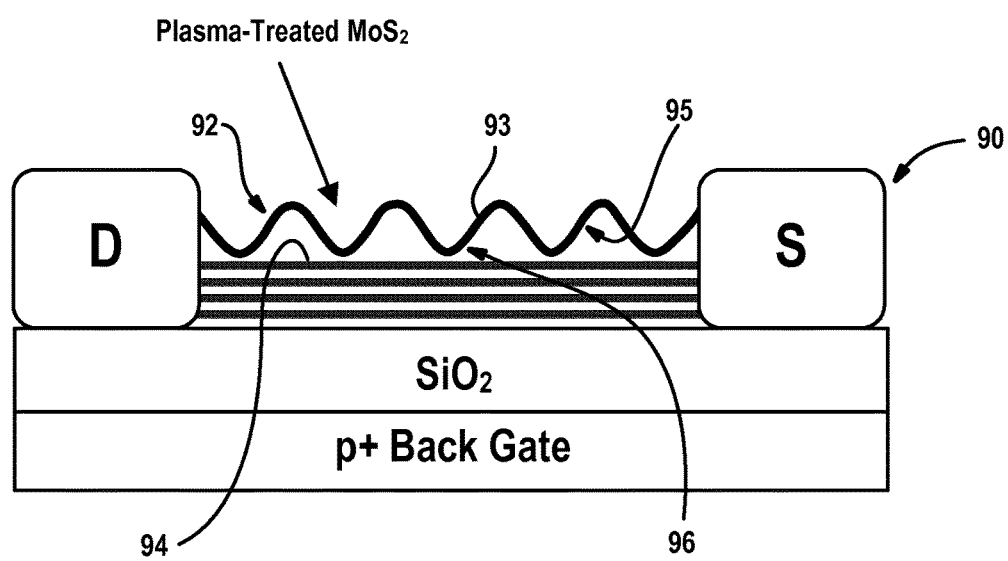
Figure 7:
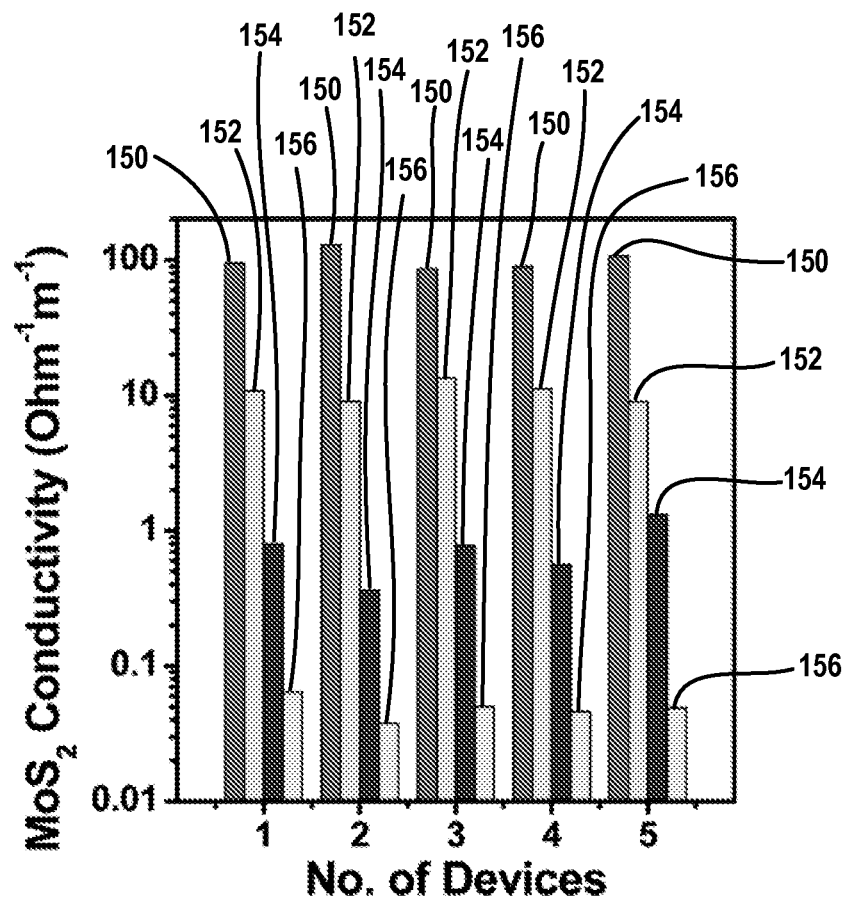
Figure 8:
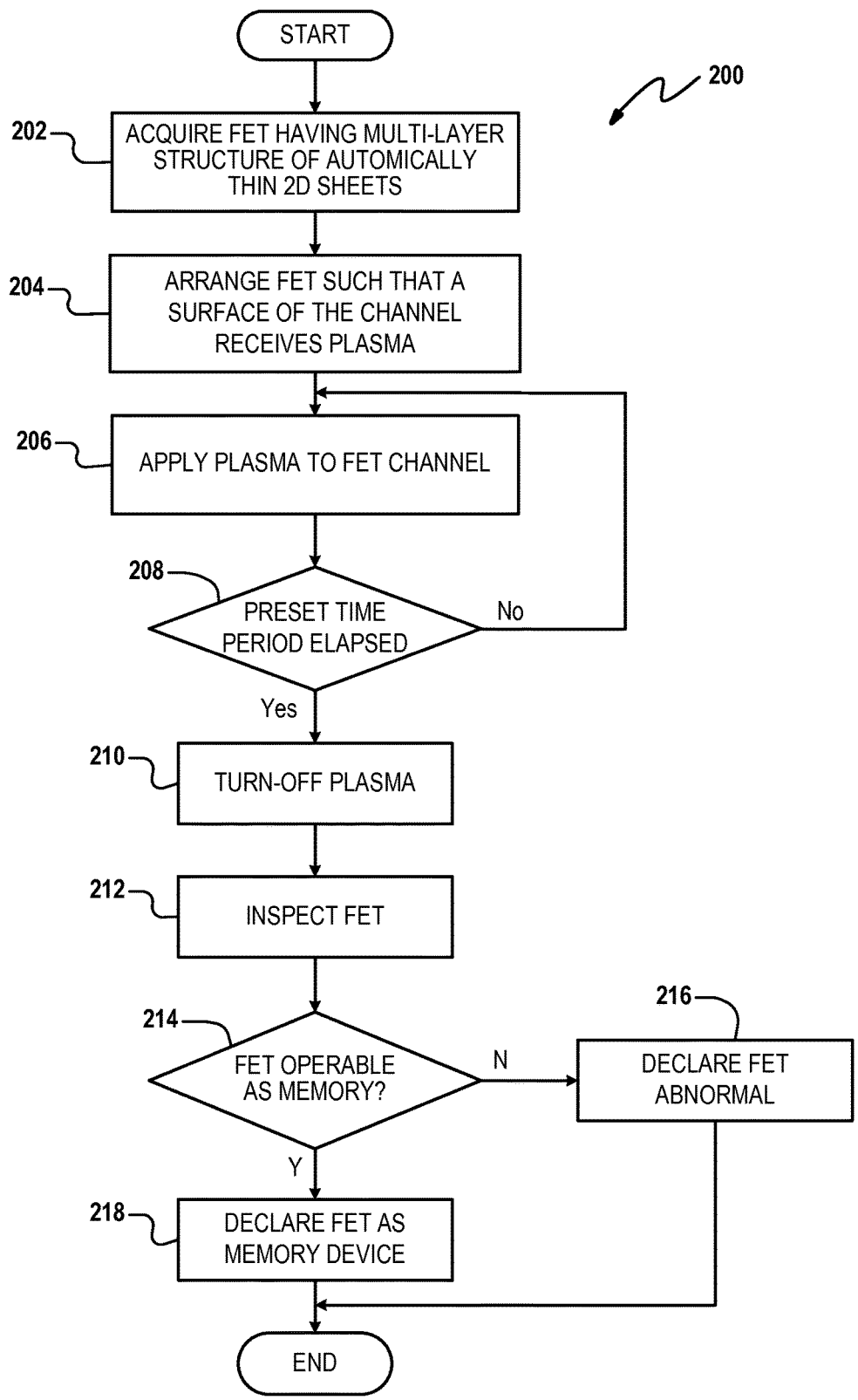

FIG. 3A is a graph of transfer curves corresponding to eight data states measured for 10 sequential cycles;

FIG. 3B is a graph of data levels recorded for 100 sequential cycles;

FIG. 4A is a graph of retention characteristics of binary data states in a microscale size memory FET;

FIG. 4B illustrates a memory FET fabricated by using selected-area plasma treatment;

FIG. 4C is a scanning electron microscope (SEM) image of a memory FET having an nanoscale plasma treated area;

FIG. 4D is a graph of retention characteristics of the binary data states of the memory FET of FIG. 4C;

FIG. 5A is an SEM image of an $O_2$ plasma-treated $MoS_2$ surface that features nanoscale roughness features;

FIG. 5B is a cross-sectional illustration of a memory FET treated with plasma;

FIGS. 5C-1, 5C-2, 5C-3, 5C-4, and 5C-5 illustrate a write and an erase scheme for memory FET;

FIG. 6A is an optical image of a plasma-treated $MoS_2$ memory FET used for Kelvin probe force microscope (KFM) imaging;

FIG. 6B are KFM images of the $MoS_2$ channel of FIG. 6A after the FET was programmed by $V_G$ pulses;

FIG. 6C is a graph of KFM scanlines showing the $V_{CPD}$ values of the $MoS_2$ channel after the FET was programmed;

FIG. 7 illustrates 2-bit data levels (i.e., "00", "01", "10", "11" states) of five $O_2$ plasma-treated memory FET that were fabricated in the same batch; and FIG. 8 is an example method for generating memory FET.

Corresponding reference numerals indicate corresponding parts throughout the several views of the drawings.

DETAILED DESCRIPTION

The present disclosure will now be described more fully with reference to the accompanying drawings. Field-effect transistors (FET) made of multi-layer structure of atomically thin two-dimensional (2D) sheets present excellent electronic and mechanical properties, low manufacturing cost, and potential large-area integration capability. The FET may be made of semiconducting layered transition metal dichalcogenides (LTMDs), such as $MoS_2$, $WSe_2$, and $WS_2$. The stacking of $MoS_2$ layers and/or other 2D layers is used for making high-performance non-volatile memory transistors. In particular, the present disclosure describes the fabrication and characterization of a non-volatile memory device formed from a FET made of the multi-layer structure of atomically thin 2D sheets.

The memory device may be a $MoS_2$-based floating-gate-free, non-volatile, multi-bit memory FET. The multi-bit memory FET is formed by treating the channel of the $MoS_2$ FET with highly energetic plasmas. The plasma-treated $MoS_2$ FET, provide reliable binary and 2-bit (i.e., 4-level) data states with potential for year-scale data retention, as well as 3-bit (i.e., 8-level) data states suitable for at least day-scale storage. The non-volatile memory device of the present disclosure may also be referred to as a memory FET.

The initial $MoS_2$ FET are fabricated by using a printing-based approach, which is described in *$MoS_2$ Transistors Fabricated via Plasma-Assisted Nanoprinting of Few-Layer-MoS2 Flakes into Large-Area Arrays*. Nam, H.; Wi, S.; Rokni, H.; Chen, M.; Priessnitz, G.; Lu, W.; Liang, X. *ACS Nano* 2013, 7, 5870-5881, the entire disclosure of which is incorporated herein by reference. Generally, to fabricate back-gated $MoS_2$ FET, the metallic drain/source contacts (5 nm Ti/55 nm Au) are fabricated by photolithography or electron-beam lithography followed by metal deposition and lift-off. In particular, photolithography is used for fabricating FET based on the inner flakes of $MoS_2$ pixels. Electron beam lithography (EBL) may be used for fabricating FET based on the outer edge ribbons of $MoS_2$ pixels. Subsequently, another metallic contact is made onto the $p^+$-Si substrate, which serves as a back gate contact.

Large-area arrays of pre-patterned multilayer $MoS_2$ features are created using bulk $MoS_2$ films that are pre-structured with relief patterns by lithographic techniques and subsequently serve as stamps for print out $MoS_2$ flakes on pristine and plasma charged $SiO_2$ substrates. While $SiO_2$ is chosen as the substrate material because SiOx-based substrates are widely used for electronic applications, the substrate may be made of other suitable material. The few-layer $MoS_2$ flake pixels printed on such SiOx substrates can be used to create the $MoS_2$ FET.

In the example embodiment, the channel thickness ($t_{MoS2}$) of the $MoS_2$ is controlled to be approximately 15-30 nm in order to achieve relatively high field-effect mobility values (e.g., $\mu$=20 to 30 $cm^2$/Vs). The channel length (L) is approximately 2 to 10 μm, and the average channel width (W) is approximately 5 to 15 μm. Ti (5 nm)/Au (50 nm) electrode pairs serve as drain (D) and source (S) contacts, which are fabricated by using photolithography followed with metal deposition and lift-off in a solvent. The $p^+$-Si substrates are used as back gates (G). Thermally grown $SiO_2$ layers (300 nm thick) are used as the gate dielectrics.

A relatively thick $SiO_2$ layers are used as gate dielectrics so that a simple color coding method for quickly locating $MoS_2$ flakes with suitable thicknesses (e.g., flakes thickness between 15-30 nm) may be employed. In this method, $MoS_2$ flakes are usually deposited on Si substrates coated with 300 nm thick $SiO_2$ layers, which results in an optimal color contrast of few-layer $MoS_2$ device features against the substrate background under the illumination of a regular photo-aligner, and may therefore make it convenient to perform overlay alignment. However, by using other advanced tools for imaging $MoS_2$ features (e.g., a Micro-Raman tool), a 300 nm thick gate dielectrics is not required and the FET may be made on thinner gate dielectrics to scale down the required programming voltages.

As described further below, the top surface layers of a $MoS_2$ FET channel is treated (or doped) with plasma in an inductively coupled plasma-based reactive ion etching (RIE) tool. As an example, for a given plasma recipe, the RF power is fixed to approximately 200 W; the pressure is approximately 10 mTorr; the precursor gas flow rate is approximately 10 sccm; and the treatment time for each FET is fixed to a preset time period (e.g., 5 seconds, 20 seconds, 1 minute, 2 minutes). The surface morphology of plasma-treated $MoS_2$ FET may be characterized by using a scanning electron microscope (SEM).

The electronic characterization of the memory FET may be performed by using a HP4145 semiconductor parameter analyzer that generates gate voltage ($V_G$) pulses with duration widths ranging from 10 ms to 1 s. To characterize the hysteretic behaviors of the transfer curves of the memory FET, a graph of the drain-source current ($I_{DS}$) versus the gate voltage ($V_G$) is acquired along two different $V_G$ sweep directions with a constant sweep rate of 10 V/s. To configure a memory FET into binary data states, a +100V $V_G$ pulse (duration Δt: 10 ms-1 s) is applied to induce a low conductance erase (ER) state and a −100V $V_G$ pulse (duration Δt: 10 ms-1 s) is applied to induce a high-conductance write (WR) state in the FET. To evaluate the retention properties of data states, time-dependent $I_{DS}$ values (i.e., $I_{DS}$-t curves) are measured under fixed $V_{DS}$ and $V_G$ (typically $V_G$=0 and $V_{DS}$=0.01 to 0.1 V) after the initial settings of the memory FET with specific $V_G$ pulses. A Kelvin force microscope (KFM) may be employed to probe the polarity and amount of the trapped charge in plasma-treated $MoS_2$ layers, which are modulated by the $V_G$ pulse amplitude.

The memory capability of the memory FET is hypothesized to be caused by the spontaneous separation of plasma-doped $MoS_2$ layers from un-doped layers, which forms an ambipolar charge-trapping layer interfacing the FET channel through a tunneling barrier. This structure enables the non-volatile retention of charged carriers as well as the reversible modulation of polarity and amount of the trapped charge, therefore resulting in multi-level data states in FET.

Figure 1A:
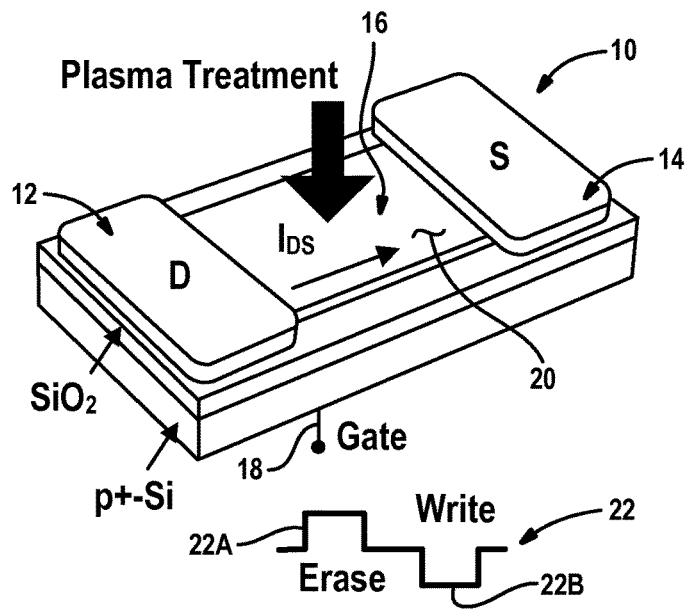
FIG. 1A illustrates a back-gated $MoS_2$ field effect transistor (FET) receiving plasma treatment.
Figure 1B:
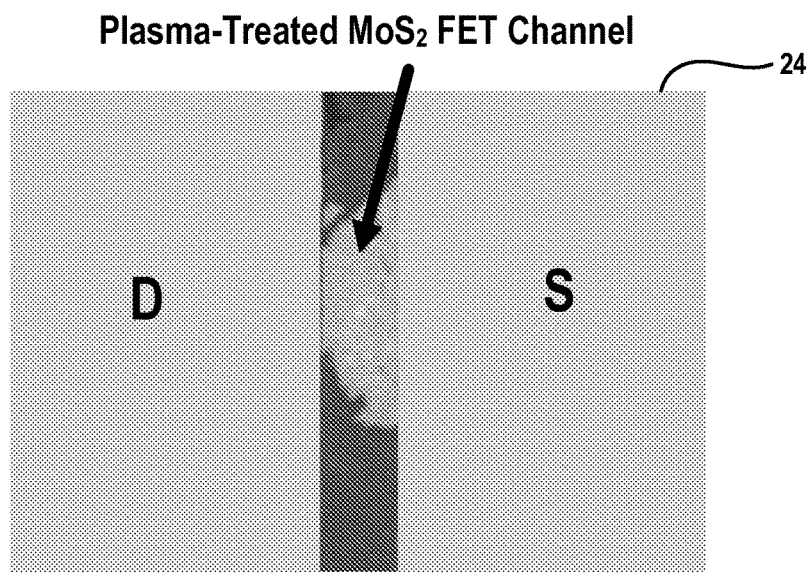
FIG. 1B is an optical micrograph image of a memory FET.

FIG. 1A illustrates a $MoS_2$ FET 10 that includes a drain (D) 12, a source (S) 14, and a channel 16 disposed between the drain 12 and the source 14. The $MoS_2$ FET 10 is a $MoS_2$-based back-gated FET having a gate 18 on an opposite side of the drain 12 and source 14. The $MoS_2$ FET 10 is formed into a memory FET by treating a top surface 20 (i.e., an exposed surface) of the $MoS_2$ channel 16 with energetic plasmas (e.g., $CHF_3$, $CF_4$, and $O_2$-based plasmas) that may be generated in the RIE. An example pulse train 22 illustrates an erase pulse 22A for setting the memory FET into the "Erase" state (or "0" state) and a write pulse 22B for setting the memory FET into the "Write" state (or "1" state). Pulses 22A and 22B can realize the binary data storage in the memory FET. FIG. 1B is an optical micrograph (OM) image 24 of a $MoS_2$ memory FET treated with $O_2$ plasma. In the example of FIG. 1B, the $MoS_2$ memory FET has the following parameters: channel length: L≈2 μm; channel width: W≈5 μm; $MoS_2$ thickness: $t_{MoS2}$≈20 nm.

Figure 1C:
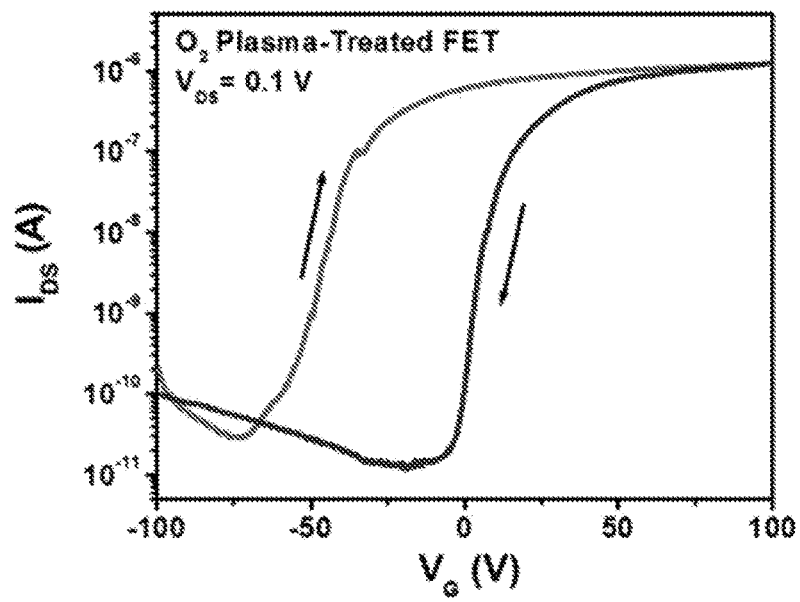
FIG. 1C is a graph of transfer curves of the memory FET of FIG. 1B.
Figure 1D:
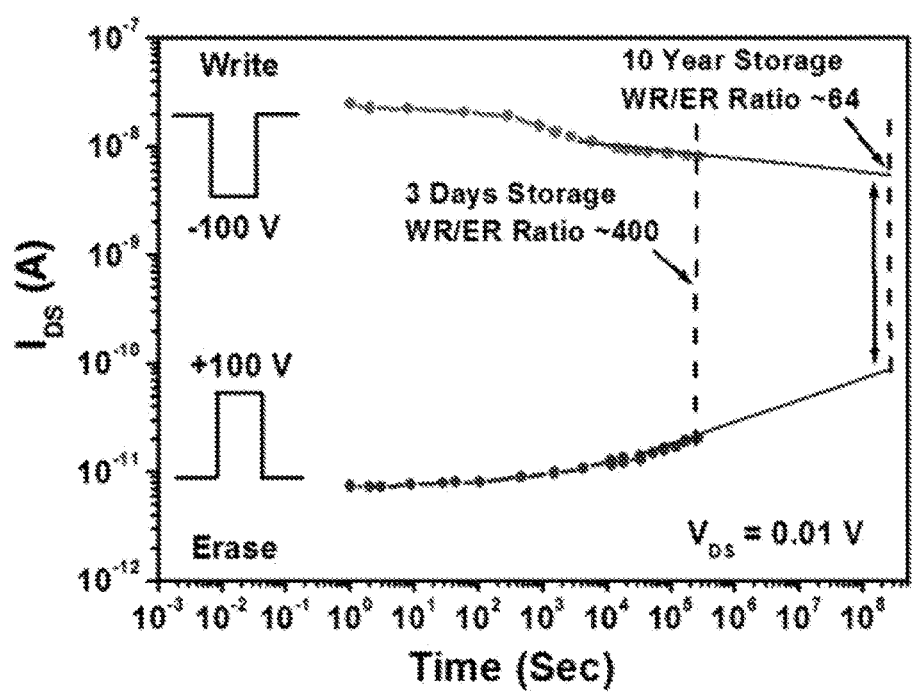
FIG. 1D is a graph of retention characteristics of the memory FET of FIG. 1B.

Plasma-treated FET exhibit well-differentiated binary data states with excellent retention properties. For example, FIGS. 1C and 1D display transfer and retention characteristics of an $O_2$ plasma-treated FET of FIG. 1B. That is, FIG. 1C illustrates transfer curves ($I_{DS}$-$V_G$ curves) that are acquired along two different $V_G$ sweep directions with a sweep rate of 10 V/s and FIG. 1D illustrates retention characteristics ($I_{DS}$-t curves) under $V_{DS}$=0.01 V and $V_G$=0 V recorded for 3 days. The memory FET exhibits a high write/erase (WR/ER) ratio (i.e., $I_{DS(WR)}/I_{DS(ER)}$) that is approximately 103 after a 1-hour retention test and approximately 400 after a 3-day retention test. Based on the 3-day retention test data plotted in FIG. 1D, the WR/ER ratio after 10 years is estimated to be approximately 64, which may still enable an unambiguous reading of distinguishable $I_{DS}$ values for "write" and "erase" states.

Plasma-induced charge-trapping levels in $MoS_2$, in comparison with, for example, un-doped $MoS_2/SiO_2$ interfaces, retain trapped charges for a longer period of time and are potentially suitable for long-term data storage applications. In addition, the areal density of such plasma-induced charge-trapping states may be estimated by using $\sigma_N = C_{ox} \Delta V_G/2e$, where $\Delta V_G$ is the hysteresis window; $C_{ox}$ is the gate dielectric capacitance; and e is the elementary charge. With $\Delta V_G$ being about 50 V, $\sigma_N$ is estimated to be $10^{12}$ cm$^{-2}$.

While the memory FET of FIG. 1B receives an $O_2$-based plasma, other plasmas may be used to treat the channel of the $MoS_2$ FET. As an example, $CF_4$ and $CHF_3$ based plasmas may also be used to treat the $MoS_2$ FET. $CF_4$ and $CHF_3$ plasma-treated FET typically exhibit relatively lower WR/ER ratios (e.g., 10 to 100 after 2000 s retention tests) in comparison with those of $O_2$ plasma-treated ones (e.g., 100 to 1,500 after 2000 s retention tests).

$O_2$ plasma-treated FET were further used for demonstrating multi-bit storage capability of the memory FET. To obtain an n-bit/FET storage capability, a memory FET needs to have at least $2^n$ distinguishable data levels. As an example, the memory FET shown in FIG. 1B is used for realizing 2-bit storage that needs 4 data levels. FIGS. 2A-1 to 2A-4 illustrate four $V_G$ signals used for configuring the memory FET into 4 data states ("00", "01", "10", "11"). The signals labeled with "00" and "11", as shown in FIGS. 2A-1 and 2A-4, are the same ±100 V, one second $V_G$ pulse signals used for setting the memory FET into binary "erase" (now as "00") and "write" (now as "11") states, respectively.

Figures 1, 2, 3, 4, 5, 5C:
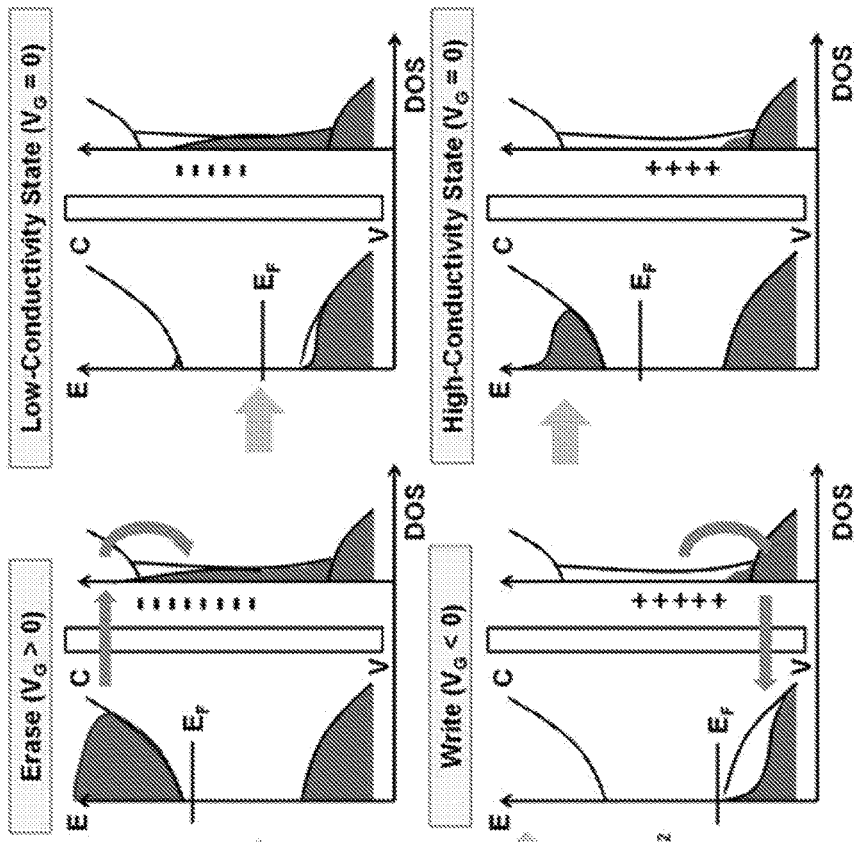

In FIG. 2A-2, the $V_G$ signal for setting the "01" state is a dual-pulse signal that consists of one −100V, one second pulse (i.e., $V_{G1}$) immediately followed with another +75V, one second pulse (i.e., $V_{G2}$). In FIG. 2A-3, the $V_G$ signal for setting the "10" state is a dual-pulse signal that consists of one +100V, one second pulse ($V_{G1}$) immediately followed with another −75V, one second pulse (i.e., $V_{G2}$). Here, the first pulse ($V_{G1}$) is used to release any previously trapped charge that has the same polarity as that of the to-be-refreshed charge or reset the FET back to the initial neutral state. The second pulse ($V_{G2}$) sets the FET with a new charging state.

FIG. 2B illustrates a 3-day retention test data of the 4 data levels of FIGS. 2A-1 to 2A-4. For these retention measurements, $V_{DS}$=0.01 V and $V_G$=0 V. Based on the extrapolated $I_{DS}$-t curves (solid lines in log scales) shown in FIG. 2B, these 4 data states are anticipated to be distinguishable after 10 years. Therefore, $O_2$ plasma-treated $MoS_2$ FET (i.e., memory FET) may serve as a 2-bit memory with a year-scale data storage capability.

In another example, a $O_2$ plasma-treated FET was set into ten distinguishable data states (i.e., "0" to "9") by using the dual-pulse $V_G$ signals illustrated in FIG. 2C. The second pulses ($V_{G2}$) of these signals have different polarities and amplitudes, which may result in different amounts and polarities of the trapped charge in the FET and therefore generate multiple data levels. FIG. 2D illustrates the retention behaviors of the ten data levels set by the signals of FIG. 2C. Based on the retention test data, it is estimated that these ten data levels are distinguishable within day-scale time durations after the initial setting. Therefore, the memory FET may enable a 3-bit (at least 8 data levels) storage capability and may be used for electronic applications requiring hour- or day-scale data storage functionalities, such as central processing unit (CPU) cache memories, disposable electronic tags, and buffer memories for displays.

To evaluate the endurance property of multi-bit memory states, an $O_2$ plasma-treated FET, such as the one illustrated in FIG. 1B, was periodically programmed into eight data states (i.e., "0" to "1" to "2" . . . to "7" then repeat) by repeatedly applying eight dual-pulse $V_G$ signals. FIG. 3A illustrates the transfer curves corresponding to eight data states measured for ten sequential cycles. In FIG. 3A, lines 30 represents $V_G$ signal for zero data state ("0" or "000"), lines 32 represents $V_G$ signal for first data state ("1" or "001"), lines 34 represents $V_G$ signal for second data state ("2" or "010"), lines 36 represents $V_G$ signal for third data state ("3" or "011"), lines 38 represents $V_G$ signal for fourth data state ("4" or "100"), lines 40 represents $V_G$ signal for fifth data state ("5" or "101"), lines 42 represents $V_G$ signal for sixth data state ("6" or "110"), and lines 44 represents $V_G$ signal for seventh data state ("7" or "111"). When the memory FET was switched into a data state, its current transfer characteristic curve (i.e., $I_{DS}$-$V_G$ curve for $V_G$=−10 to 10 V; $V_{DS}$=50 mV) was recorded. FIG. 3B plots $I_{DS}$ values (measured under $V_G$=0 V, $V_{DS}$=50 mV) of 8 data states recorded for 100 cycles. The results shown in FIG. 3B indicate that plasma-induced multi-bit memory states exhibit a good endurance property.

To evaluate the effect of the $V_G$ pulse duration ($\Delta t$) on the resulted data levels, the retention curves of the binary data levels of the memory FET was measured after applying ±100V $V_G$ pulses with different time durations ranging from 10 ms to 1 s. For the test, an $O_2$ plasma-treated FET was used, where the FET had a channel length of approximately 2 µm and width of approximately 5 µm. FIG. 4A illustrates that the $I_{DS}$ value of the write state exhibits a weak dependence on $\Delta t$, whereas the $I_{DS}$ value of the erase state highly depends on $\Delta t$, therefore resulting in a strong dependence of the WR/ER ratio on $\Delta t$. When $\Delta t$ is reduced from 1 s to 10 ms, the WR/ER ratio drops from approximately 100 to 15. This suggests that a long pulse duration ($\Delta t$>1 s) may be needed to fully charge (or discharge) all plasma-induced charge-trapping states in a microscale size FET.

Assuming that the capacitance associated with plasma-induced charge-trapping states is proportional to the total $MoS_2$ surface area treated with plasma, the required memory setting time may be reduced by reducing the total plasma-treated area. FIG. 4B illustrates a $MoS_2$ memory FET 50 having a drain 52, a source 54, and a channel 56 disposed between the drain 52 and the source 54. The channel 56 includes a selected area 58 and an unselected area 60. The selected area 58 is treated with plasma, whereas the unselected area 60 is not treated with plasma. Here, the selected area 58 is a line with a nanoscale width across the whole FET channel 56. To create the selected area 58, a polymer layer may be disposed onto the area of the channel that is not to receive the plasma (e.g., area 60). Plasma is then applied to the channel such that the area without the polymer layer is treated or doped with the plasma (e.g., area 58). The polymer layer is then removed from the channel of the $MoS_2$ FET leaving a pristine untreated area and a treated (doped) area of the channel.

As an example, FIG. 4C is a scanning electron microscope (SEM) image 64 of a $MoS_2$ FET surface with a 46 nm wide plasma-treated line region 66 across the whole FET channel and untreated pristine region 68. The region 66 is formed by using $O_2$ plasma treatment through a PMMA resist layer patterned by electron-beam lithography (EBL). That is, prior to applying the plasma to the channel, the region 66 is isolated from the region 68, so that only the region 66 receives the plasma.

FIG. 4D displays the retention curves of binary data levels of the memory FET illustrated in FIG. 4C after it was set by applying ±100V $V_G$ pulses with different time durations ranging from 10 ms to 1 s. Although the memory FET has the same total channel area (i.e., L~2 µm, W~5 µm) as that of the blank-treated FET shown in FIG. 1B, both its "write" and "erase" $I_{DS}$ values as well as WR/ER ratio exhibit a quite weak dependence on $\Delta t$ values. This indicates that the selected-area plasma treatment, as compared to the blank treatment, may result in a much smaller capacitance of plasma-induced charge-trapping states and therefore a faster memory setting speed, but can still generate reasonably good WR/ER ratios (40 to 100) suitable for practical memory-related applications. The result of FIG. 4D also indicates that the $MoS_2$ memory FET may be scaled down to the smaller devices with sub-50 nm scale channel lengths. Such sub-50 nm size memory FET are also anticipated to have the faster writing/erasing speeds as compared to the current microscale ones.

To explore the physical mechanism responsible for the memory capability of the memory FET of the present disclosure, FIG. 5A illustrates a SEM image 80 of the $MoS_2$ FET surface treated with $O_2$ plasma, where a scale bar 82 is approximately 100 nm. The SEM image 80 shows that the $O_2$ plasma-treated $MoS_2$ surface exhibits a nanoscale roughness with average period of approximately 10 nm. Such a roughness, in contrast with the flat surface of a pristine $MoS_2$ sample, is attributed to the plasma-induced doping of external atoms, which may induce an expansion of the $MoS_2$ layers and let these layers ripple up and down. This ripple effect could partially exfoliate the plasma-doped top layers from the un-doped pristine $MoS_2$ layers, where the un-doped pristine $MoS_2$ layers are under the dope layers and untreated by the plasma. The ripples of the plasma doped top layers and the un-doped pristine $MoS_2$ layers form charge-trapping sites slightly isolated from the FET channel.

By way of explanation, FIG. 5B illustrates a cross-sectional illustration of a $MoS_2$ memory FET 90 that is treated with plasma. A top few $MoS_2$ layers (i.e., treated layers 92) become rough (ripples 93) because of the doping of plasma. The treated layers 92 may include one or more layers (e.g., 1-3). A part of the treated layers 92 may be mechanically separated and electrically insulated from intact underlying layers 94. The treated layers 92 serves as a non-volatile charge-trapping layer that defines charge trapping sites 95. Plasma-induced gaps 96 defined between the charge-trapping layer (i.e., treated layer 92) and the intact $MoS_2$ channel (i.e., intact layer 94) may serve as a tunneling barrier layer for retaining trapped charges and switching the memory states. The size of the gap 96, which is defined between the charge-trapping sites and the un-doped $MoS_2$ channel is estimated to be in the same order of the magnitude as the average period of the ripple features in the top layers (i.e., 5-10 nm).

FIGS. 5C-1 to 5C-5 illustrate a band structure (i.e., the density of states (DOS) function) of a plasma-treated $MoS_2$ FET. The untreated (or pristine) $MoS_2$ layers of the FET channel region are expected to have a typical band structure of lightly doped semiconductors with a relatively low density of impurity states in the bandgap, whereas the plasma-treated top layers are expected to exhibit a rich of plasma-induced localized trapping states in the bandgap. The trapping states may be distributed over a broad energy range in the bandgap and they are likely to be a mixture of donor-type, acceptor-type, and isoelectronic deep-level traps. Such a large variety and broad energy distribution of plasma-induced traps are hypothesized based on the fact that energetic plasma species, similar to electron irradiation, may generate a broad variety of defect configurations in $MoS_2$ layers, including sulfur vacancies, substitutional donor/acceptor defects, adatoms with charge, and isoelectronic impurities. Therefore, the plasma-treated $MoS_2$ top layers may serve as an ambipolar charge-trapping layer.

FIG. 5C-1 illustrates the initial neutral state, in which the net charge in the plasma-treated layers is assumed to be close to zero (i.e., all donor-type traps are occupied with electrons, and all acceptor-type traps are vacant). To obtain an "erase" state, a positive $V_G$ pulse is applied (FIG. 5C-2). In this case, the Fermi level is elevated and the conduction (C) band of untreated layers (i.e., the FET channel) is populated with electrons. These electrons have a high probability to tunnel through the barrier and are injected into the conduction band of the plasma-treated top layers. The injected electrons may quickly relax to the localized trapping states with the lower energies. When the $V_G$ is set back to zero (FIG. 5C-3), the trapped electrons may be retained in the top layers for a long storage time, because of the existence of a barrier layer between plasma-treated and untreated layers as well as the lack of target states in the bandgap of untreated layers that may effectively prevent electrons to tunnel back from the trapping states to the FET channel.

To obtain a "write" state, a negative $V_G$ pulse is applied (FIG. 5C-4). In this case, the Fermi level is lowered and the valence (V) band of untreated layers (i.e., the FET channel) is populated with holes. These holes have a high probability to tunnel through the barrier and are injected into the valence band of the plasma-treated top layers. The injected holes may quickly relax to the localized trapping states with the lower energies. When the $V_G$ is set back to zero (FIG. 5C-5), the trapped holes may be retained in the top layers for a long storage time, because of the existence of a barrier layer between plasma-treated and untreated layers as well as the lack of target states in the bandgap of untreated layers that may effectively prevent holes to tunnel back from the trapping states to the FET channel.

The model of FIGS. 5C-1 to 5C-5 also implies that the $V_G$ pulse amplitude may modulate the total amount of charged carriers injected into the charge-trapping states in plasma-treated $MoS_2$ layers. Such trapping states, which are different from the discrete trap levels in conventional memory FET with floating gates, may be distributed over a broad energy range and may accommodate different amounts of injected carriers with different polarities, therefore resulting in multiple data levels (i.e., multiple $I_{DS}$ values). Such a hypothesized model could preliminarily explain the observed multi-bit data storage capability.

In addition, as implied by this model, the electrons of erase state (or the holes for write) that are trapped at relatively high-energy states and are close to the conduction (or valence for write) band could easily tunnel back to the FET channel and result in a slow relaxation of $I_{DS}$ values with time. During the initial memory setting, the higher $V_G$ pulse could induce the trapping of more charged carriers in such high-energy states and therefore result in a more prominent relaxation of $I_{DS}$ values with time. This implication from the model is consistent with the observation in the retention tests illustrated in FIGS. 2C and 2D that the data states with the highest or the lowest $I_{DS}$ values, typically configured by ±100V $V_G$ pulses, exhibit more prominent relaxation behaviors than other intermediate data states between them.

To further support and verify that plasma-treated $MoS_2$ layers indeed serve as charge-trapping layers, a Kelvin force microscope (KFM) is utilized to image and measure the contact potential (or work function) difference ($V_{CPD}$) between $V_G$-modulated $MoS_2$ FET surfaces and the KFM tip. FIG. 6A illustrates an optical image (OM) 100 of an $O_2$ plasma-treated $MoS_2$ FET (i.e., memory FET) having plasma treated channel 102. In OM 100 a dashed box 104 denotes a KFM-imaged area.

FIG. 6B shows a KFM image 110 that was captured after the FET was configured by applying a −100V, 1 s $V_G$ pulse 112 and a KFM image 114 that was captured after the FET was configured by applying a +100V, 1 s $V_G$ pulse 116. Scanlines denoted by the solid lines 118 and 120 are accordingly plotted in FIG. 6C. FIGS. 6B and 6C show that the polarity switching of the applied $V_G$ pulse may accordingly switch the $V_{CPD}$ polarity on the $MoS_2$ surface but does not noticeably change the $V_{CPD}$ value on the $SiO_2$ surface. Here, the $V_{CPD}$ value on the $MoS_2$ surface is directly associated with the electrostatic interaction between the trapped charge in the top $MoS_2$ layers and the KFM tip. It should be noted that the charge trapped at other interfaces (e.g., $MoS_2/SiO_2$ and $Si/SiO_2$ interfaces) may hardly affect the $V_{CPD}$ value on the $MoS_2$ surface because of the screening effect of multilayer $MoS_2$ channels (the electric-field screening length in $MoS_2$ is 3-5 nm; the thickness of our FET channels is 20-30 nm). Therefore, the $V_G$-modulated memory states observed in the $MoS_2$ FET are attributed to the charge-trapping states in plasma-treated top $MoS_2$ layers, which may enable the ambipolar charge retention and modulation.

Although the electric field generated by the back gate is expected not to directly affect the charge-trapping states in the plasma-treated top layers, this gating field may directly modulate the carrier (electron or hole) concentrations in the untreated layers, and these densely populated carriers could diffuse to the interface between untreated and treated layers and subsequently transport through the tunneling barrier formed at this interface, as illustrated in FIGS. 5C-1 to 5C-5). In this way, the back gate voltage could indirectly modulate the charge trapping and switching in the top $MoS_2$ layers.

By unifying processing conditions and device geometries, it is possible to make large arrays of plasma-treated $MoS_2$ memory FET with high uniformity in all registered data levels. As an example, five memory FET that were fabricated in the same batch and were expected to have very similar doping profiles in their $MoS_2$ channels. All five devices have very close $MoS_2$ channel thicknesses (20 to 25 nm) and lengths (~5 μm), but very different channel widths (2-10 μm). To eliminate the effect of lateral pattern shapes on the memory data levels, average conductivity (σ) values, instead of $I_{DS}$ values, of $MoS_2$ channels were used to denote the memory states. FIG. 7 plots the 2-bit data levels of the five memory FET (i.e., 1-5 along x-axis), which were measured after the FET were set by the $V_G$ signals listed in FIG. 2A. In FIG. 7, data state "00" is represented by bars 150, data state "01" is represented by bars 152, data state "10" is represented by bars 154, data state "11" is represented by bars 156. As shown, the FET exhibit a reasonably good uniformity and consistency in all plasma-induced data levels.

The method for forming the memory FET of the present disclosure can be generalized with reference to FIG. 8. FIG. 8 is a flowchart of an example method 200 for making a memory FET of the present disclosure. At 202, a FET having multi-layer structure of atomically thin 2D sheets is acquired. The FET may be made of transition metals, such as $MoS_2$, $WSe_2$, and $WS_2$.

At 204 the FET is arranged such that a surface (i.e., top surface) of the channel receives plasma. At 206, plasma (e.g., $CHF_3$, $CF_4$, and $O_2$-based plasmas) is applied to the channel of the FET for a preset time period, such as 5 seconds, 15 seconds, one minute, or other suitable time period for forming the charge trapping sites. The plasma causes one or more of the layers of the channel region to wrinkle or form ripples. That is, the plasma induces an expansion of the $MoS_2$ layers causing the one or more layers to ripple up and down to form a plasma-doped layer that slightly separates from an un-doped pristine $MoS_2$ layers. The un-doped pristine $MoS_2$ layers are under the doped layers and are untreated by the plasma. The ripples of the plasma doped layers and the un-doped pristine $MoS_2$ layers form charge-trapping sites.

At 208, the method determines if the preset time period has elapsed. If the preset time period has not elapsed, plasma is still applied to the channel at 206. If the preset time period has elapsed, the plasma is turned off at 210, and at 212 the FET is inspected to determine if the FET operates as a memory. That is, the inspection may analyze the channel to determine if the channel includes un-doped plasma layers and plasma treated layers having ripples that form the charge-trapping sites. The inspection can be a series of test that analyzes the structure and/or performance of the FET. At 214, the method determines if the FET is operable as a memory based on the inspection at 212. If the FET is not operable as a memory, the FET is declared as abnormal at 216. If the FET is operable as a memory, the FET is declared as a memory device at 218.

If the memory FET is configured to have a nanoscale plasma treated area, as shown in FIGS. 4B and 4C, than a selected region of the channel that is to receive the plasma may be isolated from the other region of the channel that is not to receive the plasma. For example, at 202, a polymer layer may be disposed at the region of the channel that does not receive the plasma. After the plasma is applied at 210 the polymer layer is removed from the region. Thus, a selected region of the channel is doped with the plasma and the region that included the polymer layer is not doped.

Once formed, the memory FET may be used as a multi-bit memory device. For instance, a first pulse is applied for setting the memory FET into an erase state or "0" state and a second pulse is applied for setting the memory FET into the write state or "1" state). The first pulse and the second pulse may be of opposite polarity (e.g., erase +100V and write −100V) and are used to store binary data in the memory FET.

The memory devices of the present disclosure are plasma-treated $MoS_2$ FET and serve as multi-bit memory devices with a year-scale 2-bit/transistor (or day-scale 3-bit/transistor) storage capability. The data storage capability is attributed to the plasma-induced ripple and partial separation of the top $MoS_2$ layers from the underlying pristine layers, which form a memory FET structure bearing an ambipolar charge-trapping layer coupled with the FET channel through a tunneling barrier. Such multi-bit memories exhibit a unique combination of excellent retention and endurance characteristics, extremely simple structures, and low fabrication costs. The programming speed of such memories may be increased by using nanoscale-area plasma treatment processes.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for generating a non-volatile memory device, the method comprising:
applying a plasma for a preset time period to an exposed surface of a channel of a field effect transistor such that a plurality of charge-trapping sites are formed at the channel, wherein the channel is comprised of a multi-layer structure of two-dimensional material;
wherein the charge-trapping sites are formed between a first layer and a second layer of the channel, the first layer is treated with the plasma and is above the second layer of the channel, the second layer of the channel is not treated by the plasma, the first layer includes one or more sheets and the second layer includes one or more sheets different from the first layer.

2. The method of claim 1 wherein the preset time period is set between 5-20 seconds.

3. The method of claim 1 wherein the preset time period is equal to or greater than one minute.

4. The method of claim 1 wherein the channel is made of a transition metal.

5. The method of claim 1 wherein the plasma is made of oxygen.

6. The method of claim 1 further comprising:
applying a polymer layer to a first area of the channel prior to applying the plasma, wherein the channel has the first area and a second area not having the polymer layer, and the first area is smaller than the second area; and
removing the polymer layer from the first area after applying the plasma to the channel.

7. The method of claim 1 wherein the plasma has at least one of a radio frequency power of approximately 200 W, a pressure of approximately 10 mTorr, and a precursor gas flow rate of approximately 10 sccm.

8. A memory device comprising:
a field effect transistor including a source, a drain, a gate, and a channel portion located between the source and the drain, wherein:
the channel portion is comprised of a multi-layer structure of two-dimensional material, wherein the channel portion includes a first layer having multiple ripples and a second layer, such that multiple charge gaps are defined between the first layer and the second layer,
wherein the first layer is a plasma-doped layer and the second layer is an un-doped layer.

9. The memory device of claim 8 wherein the channel is made of a transition metal.

10. The memory device of claim 8 wherein the second layer is substantially flat and under the first layer.

11. The memory device of claim 8 wherein the field effect transistor is made of molybdenum disulfide.

12. The memory device of claim 8 wherein a memory setting speed is proportional to an area of the channel that includes the charge gaps.

13. The memory device of claim 8 wherein the field effect transistor is a back gated transistor.

14. The memory device of claim 8 wherein the field effect transistor stores n-bits and includes $2^n$ distinguishable data levels, and n is an integer.

15. The memory device of claim 8 wherein the first layer includes one or more sheets and the second layer includes one or more sheets different from the first layer, the one or more sheets of the first layer are doped with plasma, and the one or more sheets of the second layer are un-doped.

16. A memory device comprising:
a field effect transistor including a source, a drain, a gate, and a channel portion located between the source and the drain,
wherein the channel portion is comprised of a multi-layer structure of two-dimensional material, wherein the channel portion includes a first layer having multiple ripples and a second layer, such that multiple charge gaps are defined between the first layer and the second layer,
wherein the field effect transistor stores n-bits and includes $2^n$ distinguishable data levels, and n is an integer.

* * * * *